(12) United States Patent
Alter et al.

(10) Patent No.: US 7,586,132 B2
(45) Date of Patent: Sep. 8, 2009

(54) POWER FET WITH LOW ON-RESISTANCE USING MERGED METAL LAYERS

(75) Inventors: Martin Alter, Los Altos, CA (US); Richard Dolan, Pleasanton, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/758,967

(22) Filed: Jun. 6, 2007

(65) Prior Publication Data
US 2008/0303097 A1   Dec. 11, 2008

(51) Int. Cl.
H01L 27/10 (2006.01)
H01L 29/74 (2006.01)
H01L 29/739 (2006.01)
H01L 29/73 (2006.01)
H01L 29/76 (2006.01)
H01L 29/94 (2006.01)
H01L 31/062 (2006.01)
H01L 31/113 (2006.01)
H01L 31/119 (2006.01)

(52) U.S. Cl. .................. 257/211; 257/202; 257/207; 257/208; 257/341; 257/401; 257/758; 257/759; 257/760; 257/E27.001

(58) Field of Classification Search .............. 257/202, 257/207–208, 211, 758–760, 341, 401, E27.001
See application file for complete search history.

(56) References Cited

U.S. PATENT DOCUMENTS

| 5,355,008 | A | | 10/1994 | Moyer et al. | |
|---|---|---|---|---|---|
| 5,391,895 | A | * | 2/1995 | Dreifus | 257/77 |
| 5,900,668 | A | * | 5/1999 | Wollesen | 257/522 |
| 6,133,582 | A | * | 10/2000 | Osann et al. | 257/48 |
| 6,159,841 | A | * | 12/2000 | Williams et al. | 438/619 |
| 6,271,542 | B1 | * | 8/2001 | Emma et al. | 257/67 |
| 6,326,217 | B1 | * | 12/2001 | McDowell et al. | 438/3 |
| 6,445,018 | B1 | * | 9/2002 | Okuaki | 257/211 |
| 6,649,955 | B2 | * | 11/2003 | Lee | 257/295 |
| 7,038,280 | B2 | * | 5/2006 | Righter | 257/355 |

(Continued)

FOREIGN PATENT DOCUMENTS

EP        0714128 A2    5/1996

OTHER PUBLICATIONS

European Search Report, 7 pages.

*Primary Examiner*—Ida M Soward
(74) *Attorney, Agent, or Firm*—Patent Law Group LLP

(57) ABSTRACT

In one embodiment, relatively thin but wide metal bus strips overlying a high power FET are formed to conduct current to the source and drain narrow metal strips. A passivation layer is formed over the surface of the FET, and the passivation layer is etched to expose almost the entire top surface of the bus strips. A copper seed layer is then formed over the surface of the wafer, and a mask is formed to expose only the seed layer over the bus strips. The seed layer over the bus strips is then copper or gold electroplated to deposit a very thick metal layer, which effectively merges with the underlaying metal layer, to reduce on-resistance. The plating metal does not need to be passivated due to its thickness and wide line/space. Other techniques may also be used for depositing a thick metal over the exposed bus strips.

10 Claims, 4 Drawing Sheets

U.S. PATENT DOCUMENTS

| | | | |
|---|---|---|---|
| 7,215,388 B2* | 5/2007 | Fukuhara | 349/43 |
| 7,419,901 B2* | 9/2008 | Hotta et al. | 438/622 |
| 2001/0030365 A1* | 10/2001 | Otsuka et al. | 257/758 |
| 2002/0179940 A1* | 12/2002 | Osada et al. | 257/204 |
| 2003/0080428 A1* | 5/2003 | Izumitani et al. | 257/758 |
| 2005/0067633 A1* | 3/2005 | Mushika | 257/202 |
| 2005/0127347 A1* | 6/2005 | Choi et al. | 257/2 |
| 2006/0154469 A1 | 7/2006 | Hess et al. | |
| 2007/0029676 A1* | 2/2007 | Takaura et al. | 257/758 |
| 2007/0096197 A1* | 5/2007 | Jang et al. | 257/315 |
| 2007/0176214 A1* | 8/2007 | Kwon et al. | 257/250 |
| 2007/0228560 A1* | 10/2007 | Yuzawa et al. | 257/734 |

* cited by examiner

POWER FET WITH LOW ON-RESISTANCE USING MERGED METAL LAYERS

FIELD OF THE INVENTION

This invention relates to high power field effect transistors (FETs) and, in particular, to a technique for reducing the on-resistance of such FETs using an additional metal layer.

BACKGROUND

One type of conventional high power FET is formed by creating long rows of alternating source and drain regions separated by a channel region. A gate overlies the channel region. The gate width is thus very large to create a high current FET. The source and drain regions are the same conductivity type, and a threshold voltage on the gate creates a conductive channel between the source and the drain to conduct current. Such a transistor is a lateral FET. Narrow metal strips contact and interconnect the source regions, and other metal strips contact and interconnect the drain regions.

Another type of high power lateral FET forms cells of source and drain regions separated by a channel, where a gate overlies the channel. Each adjacent cell pair forms a single transistor, and the cells are all connected in parallel by narrow metal strips to conduct a high current.

High power FETs may also be vertical transistors, using double diffusion, where the doped regions formed in the silicon surface are all source and channel regions, and a voltage on the gate inverts the channel region. The current path is then vertical, where the drain is the bottom surface of the silicon substrate. A metal layer contacts all the source regions. Another type of vertical FET uses a vertical gate.

Various types of high power FETs are described in U.S. Pat. No. 5,355,008, co-invented by the present inventor and incorporated herein by reference.

In very high power FETs, such as those conducting one amp or more, the high current creates a significant voltage drop across the metal overlying and contacting the doped regions, due to the inherent resistivity of the metal layer. Although the on-resistance can be lowered by making the metal thicker, problems arise in masking, etching, and passivating such thick metal. Additionally, the same metal layer may be patterned for interconnecting components of low power circuitry formed on the same chip as the high power FET, and a thick metal layer would undesirably increase the minimum possible line width.

One solution for lowering the on-resistance is creating an insulating layer over the first-layer metal strips (formed by a first metal layer) and forming vias (small holes) in the insulating layer over portions of the first-layer metal strips. A wide metal source bus strip (formed by a second metal layer), perpendicular to the narrow source metal strips, is then formed over the insulating layer and in the vias to provide a low resistance coupling to each of the first-layer source metal strips. A similar wide drain metal bus strip may be formed to contact the first-layer drain metal strips.

Although the wide bus strips reduce on-resistance, there are significant drawbacks in making the bus strips thick. Firstly, depositing, masking, and etching a thick metal is time consuming. Secondly, the second metal layer may be patterned for interconnecting other circuits, and a thick metal layer increases the minimum possible line width. Thirdly, it is difficult to thoroughly passivate a thick metal layer due to the high step.

Forming additional overlying metal layers, connected to the underlying metal with vias through an insulating layer, for further reducing on-resistance similarly require substantial time to deposit, mask, and etch the metal. Additionally, the small vias incur some voltage drop due to their small cross-sectional area.

What is needed is a simple technique to form thick metal conductors overlying a high power FET for conducting source or drain current.

SUMMARY

In one embodiment, relatively thin but wide metal bus strips overlying a high power FET are formed to conduct current to the source and drain narrow metal strips. A passivation layer is formed over the surface of the FET, and the passivation layer is etched to expose almost the entire top surface of the bus strips. The exposed bus strips are then coated with a very thin suitable seed layer, such as copper in the case of copper electroplating. After a single masking step, a very thick metal (e.g., copper) layer is then plated over the exposed bus strips. The thin metal bus and the thick metal plating are considered to be merged. If only vias were formed in the passivation layer, such a plating process would not adequately reduce on-resistance, since the thin bus would only be contacted at points and therefore still carry the transistor current.

The plating metal does not need to be passivated, since the underlying structure is already protected by passivation, the metal is very wide, and the spacings between neighboring metal portions are also very wide.

The plating process is performed on a wafer scale prior to dicing of the chips. Multiple wafers may be plated at the same time.

An additional benefit of this technique is that the plating process may be performed by an outside vendor without any contamination of the wafer during the transportation of the wafers, since the wafers are already passivated and do not need to go back into the fab which built the wafers.

Other techniques may also be used for depositing a thick metal over the exposed bus strips, such as sputtering, flash evaporation, or other well known techniques. Such deposition is greatly simplified by the wide lines and spaces (e.g., no problems with alignment or voids) and the fact that this last metal layer does not need to be passivated.

This technique may also be applied to a metal layer conducting FET current other than the metal bus. This technique may be used to form a thick top metal in any type of FET.

BRIEF DESCRIPTION OF THE DRAWINGS

Elements in the various figures labeled with the same numeral may be identical.

DETAILED DESCRIPTION

Figure 1:
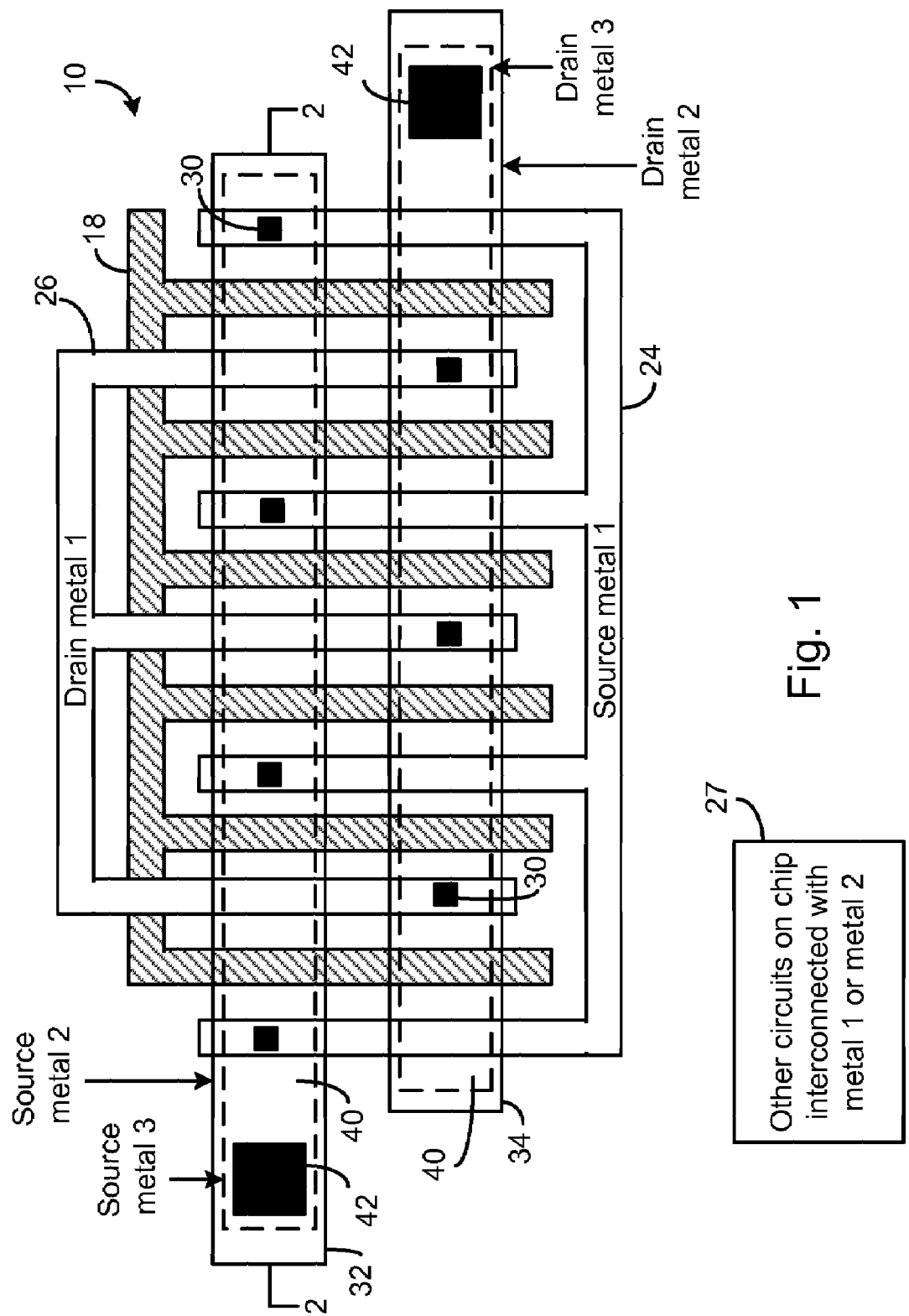
FIG. 1 is a simplified front view of a lateral high power FET formed in accordance with one embodiment of the invention.
Figure 2:
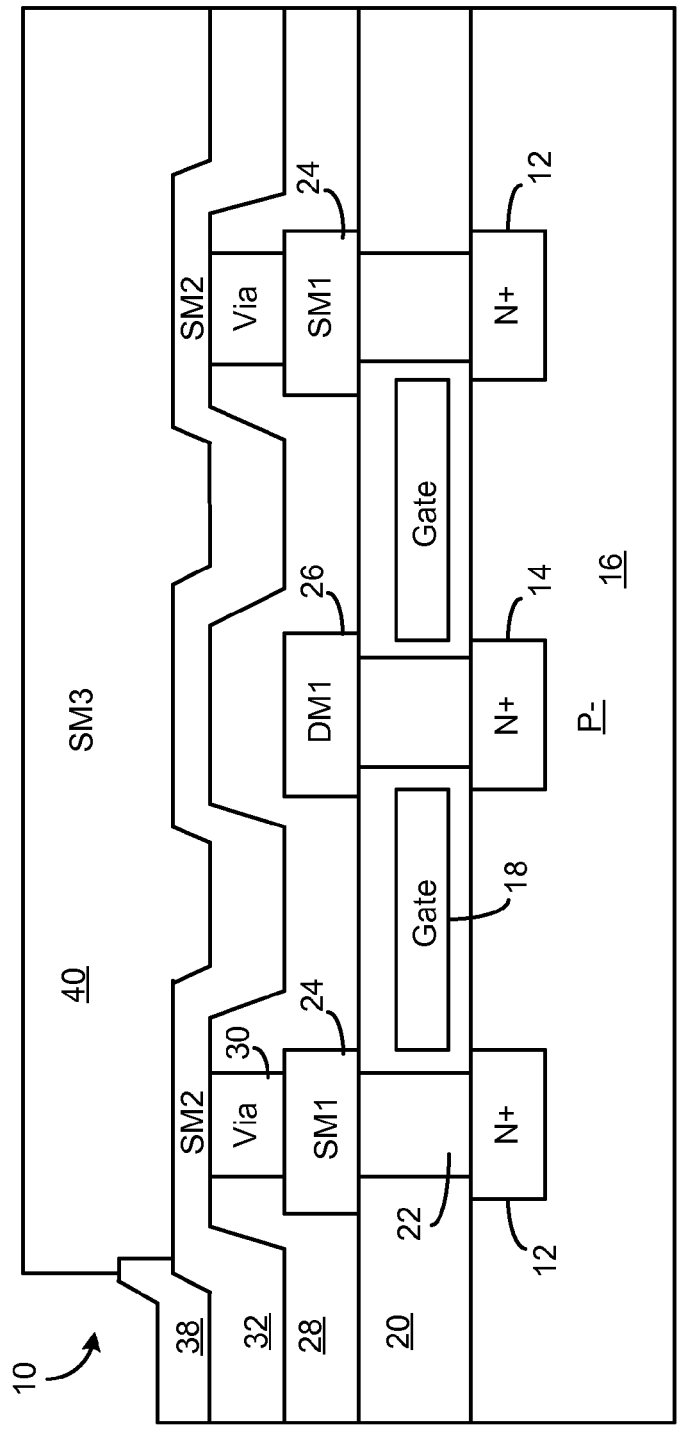
FIG. 2 is a partial cross-sectional view of the FET of FIG. 1 along line 2-2.

FIG. 1 illustrates a simplified high power lateral FET 10. In an actual lateral FET, there would be many more rows of alternating source and drain strips. FIG. 2 is a partial cross-section along line 2-2 in FIG. 1. The invention may apply to any type of FET, and the particular example of an n-channel lateral FET is not intended to be limiting. For example, the invention may be applied to N-channel or P-channel cellular FETs and vertical FETs, such as described in U.S. Pat. No. 5,355,008, assigned to the present assignee and incorporated herein by reference.

N-type source regions 12 (FIG. 2) and n-type drain regions 14 are formed in a p-type layer 16 (or p-type tub) of a silicon substrate. The various conductivity types may be reversed for a p-channel FET. Gate oxide is grown over the channel regions, and doped polysilicon gates 18 are formed. The gates 18 are connected to a voltage source (not shown) for turning on and off the transistor.

A first insulating layer 20, such as BPSG, is then formed over the surface, and contact holes 22 are etched in the insulating layer 20.

A first metal layer (metal 1) is deposited over the surface and etched to form the source metal 24 and the drain metal 26. The first metal layer also fills the contact holes 22 to contact areas of the source and drain regions 12 and 14. A thin barrier metal, such as a tungsten alloy, may first be formed over the exposed silicon as a barrier layer between the first metal layer (e.g., AlSiCu) and the silicon.

The metal layer 1 is thin (e.g., less than 1.0 micron) to simplify processing steps, such as depositing, fine-line masking, and etching the metal, as well as enabling the formation of a quality insulation layer over the structure. The metal layer 1 may also be patterned for use in low power circuitry 27 on the same chip, and an increased thickness reduces the minimum line width possible. Without any additional metal layers, the inherent resistivity of the long, narrow, and thin source and drain metal 24 and 26 would create a substantial voltage drop at high currents since the source and drain metal strips are only electrically contacted at one end.

A second insulating layer 28 of oxide is deposited on the surface and etched to form vias 30 over various points along the source and drain metal 24 and 26. For simplicity in FIG. 1, only one via 30 is shown for each source and drain metal strip.

Next, a second metal layer (metal 2) is deposited and etched to form relatively wide source and drain busses 32 and 34 perpendicular to the source and drain metal 24 and 26 (FIG. 2 is cut along the source bus 32). The metal 2 also fills the vias 30 to contact the source and drain metal 24 and 26. Due to their width, the busses provide a relatively low resistance current path to the source and drain metal 24 and 26. The second metal layer 32 must still be relatively thin (e.g., less than 3.0 micron) to simplify processing steps, such as depositing, masking, and etching the metal, as well as enabling the formation of a quality insulation layer over the structure. The metal layer 2 may also be patterned for use in low power circuitry on the same chip, and the increased thickness reduces the minimum line/width that is useable in digital/analog areas.

The on-resistance of the busses 32 and 34 is decreased using the following inventive process. A third insulating layer 38, such as nitride (a protective passivation layer), is formed over the surface of the entire FET (and other circuits if any), and a large area over each of the busses 32 and 34 is exposed by etching the third insulating layer 38. A thick third metal 40 (e.g., AlCu or AlSiCu) is then deposited onto the exposed busses 32 and 34 to create a very low resistance conductor even at the highest currents for FETs. The thickness of the third metal 40 may be considerably greater than 3.0 microns without any drawbacks, since the third metal layer is not used for any other circuits on the chip. If the third metal 40 is copper based, its resistivity is much less than the Al based metal used for the underlying metal layers. The combination of the thickness and material of the third metal 40 greatly reduce the voltage drop of the FET.

Since the third metal 40 is thick and wide, and since there are large spaces between conductors, the third metal 40 does not require passivation, and passivation is optional. FIG. 1 shows the metal 40 in dashed outline, generally corresponding to the opening in the nitride passivation layer 38 (FIG. 2).

The third metal 40 can be formed by plating, sputtering, flash evaporation, or any other deposition technique. Gold may also be a suitable metal 40.

Suitable bonding pads 42 are then formed on the metal 40 for wire bonding, if necessary. The wire bonding can be anywhere along the length of the thick metal 40. If it is desired to not have the wire bonding pads over the thick metal 40, the mask used for defining the metal 40 can cover the areas of the underlying metal layer (e.g., aluminum) where the pads are to be. After the busses are copper-plated, the pad area is then exposed, and gold wires may then be easily bonded to the aluminum. This process is advantageous since it is difficult to bond gold wires to copper, and additional processes need to be performed to form Au/Ni or Pd/Ni bonding pads over the copper. By not plating areas of the aluminum busses and later using those areas as bond pads, several processing steps are avoided.

In one embodiment, the fabrication facility fabricating the chip is a clean room. The facility forms the wide openings over the busses 32 and 34 and blanket-deposits the thin layer of copper over the exposed busses 32 and 24 and elsewhere over the wafer in a conventional copper sputter process. This thin copper layer acts as a seed layer in a subsequent plating step. The wafer may then be taken out of the clean room and transported to an outside vendor for performing a single masking step to expose the thin copper layer only over the top of the busses 32 and 24 and then plating a very thick copper layer (e.g., 2.5 microns-40 microns) over the exposed copper layer. The mask and thin copper not over the busses 32 and 24 are then removed in a conventional process.

In another embodiment, the masking step before the plating is not performed, and the entire surface of the wafer is plated over the seed layer. The wafer is then subjected to a chemical-mechanical planarization (CMP) step that removes all the copper except the copper within the trenches formed in the third insulating layer 38 over the busses 32 and 34. The third insulating layer 38 must be made thick in such a case. When using this CMP method, it is preferred that the wafer surface also be planarized after forming the second insulating layer 28 over the busses 32 and 34.

Methods for copper plating integrated circuits are well known. Certain copper plating methods are described in U.S. Pat. Nos. 6,432,753, 6,610,600 and 6,037,258, incorporated herein by reference. The seed and plating metal may also be Au.

Figure 3:
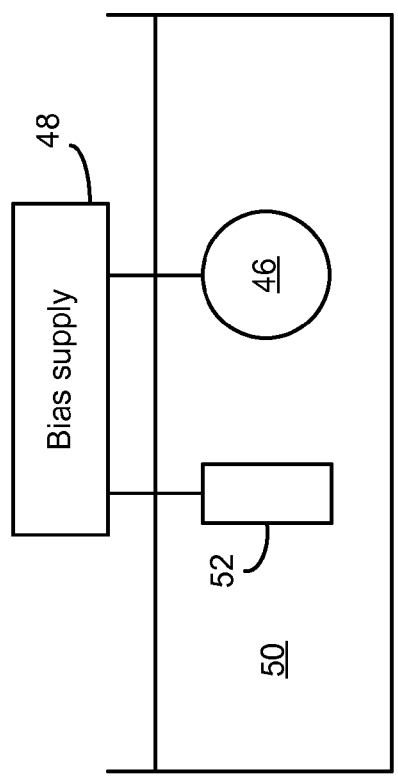
FIG. 3 schematically illustrates the wafer-level plating to form a thick metal layer over the source and drain metal busses for reducing on-resistance.

FIG. 3 illustrates a simplified plating process for forming metal 40.

The wafer 46, along with other similar wafers, is placed in an electrolyte solution 50. A copper electrode 52 is placed in the solution and biased so that the copper atoms travel through the solution and plate the exposed wafer surface. Details of copper electroplate are well known and need not be described in detail.

After the metal 40 is formed and wire bonding pads created (if necessary), the dies are separated, and the chips are packaged (e.g., chips mounted on lead frames and wires bonded to pads 42 and package leads, etc.). No further passivation is needed since the metal 40 is so robust.

Figure 4:
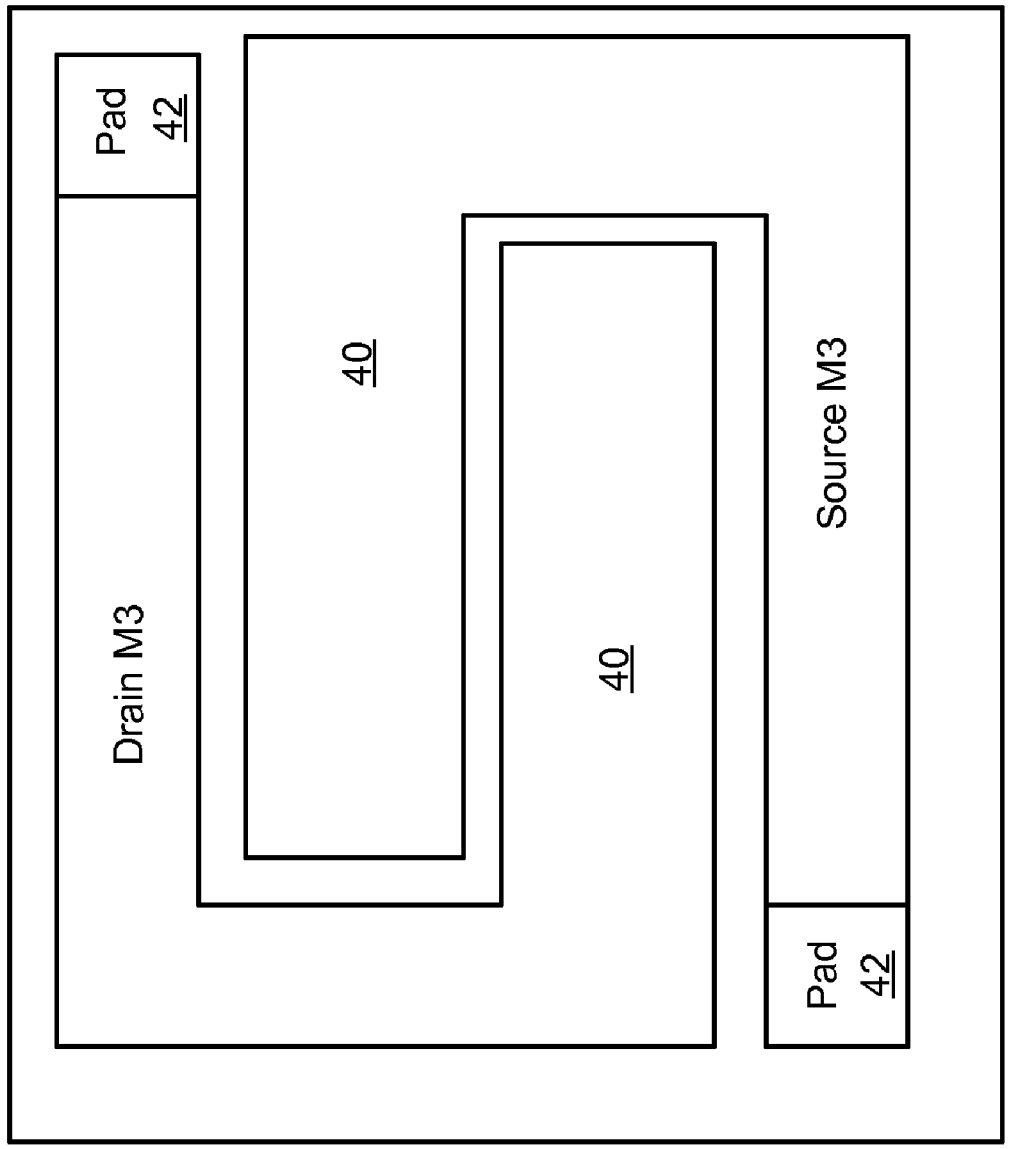
FIG. 4 is a front view of another embodiment of a metal pattern for the merged-thick metal layer over the FET.

FIG. 4 illustrates a pattern of metal 40 and busses that is different from the simple horizontal strips shown in FIG. 1. FIG. 4 is a top down view of a high power FET chip 58 formed using the present invention. The thick metal 40 is on top, with pads 42 for wire bonding to the package terminals (the gate pad is not shown for simplification). The source and drain metal 24 and 26 strips (FIG. 1) are in the vertical direction under the metal 40 in FIG. 4. The serpentine merged-metal pattern, made up of serpentine source and drain busses with the overlying thick metal 40, electrically contacts most source and drain metal strips at two areas of the strips for reduced on-resistance. In one embodiment, the chip in FIG. 4 may be on the order of 30×30 mils.

In one embodiment, the bonding pads 42 are Au/Ni or Pd/Ni pads formed over the metal 40 (e.g., copper). In another embodiment, pads 42 are end portions of the aluminum busses that have not been plated with metal 40.

The optimal metal 40 pattern may be different for different types of FETs, such as cellular, lateral, vertical, etc. In a vertical FET, the thick merged-metal 40 would only contact source regions on the top surface of the chip. Gates in a vertical FET may be vertical or lateral.

In a preferred embodiment, the thick metal 40 is merged with at least 25 percent of the top surface area of the underlying metal (e.g., busses 32 and 34), determined by the large continuous opening in the insulating layer exposing at least 25 percent of the underlying metal. In a more preferred embodiment, at least 50 percent of the underlying metal is covered by the thick metal 40. In another embodiment, at least 75 percent of the underlying metal is covered by the thick metal 40. The thickness of the metal 40, relative to the thickness of the underlying metal, causes the metal 40 to carry a majority of the FET current to reduce on-resistance. In one embodiment, the metal 40 is at least twice the thickness of the underlying metal layer (e.g., bus 32).

Figure 5:
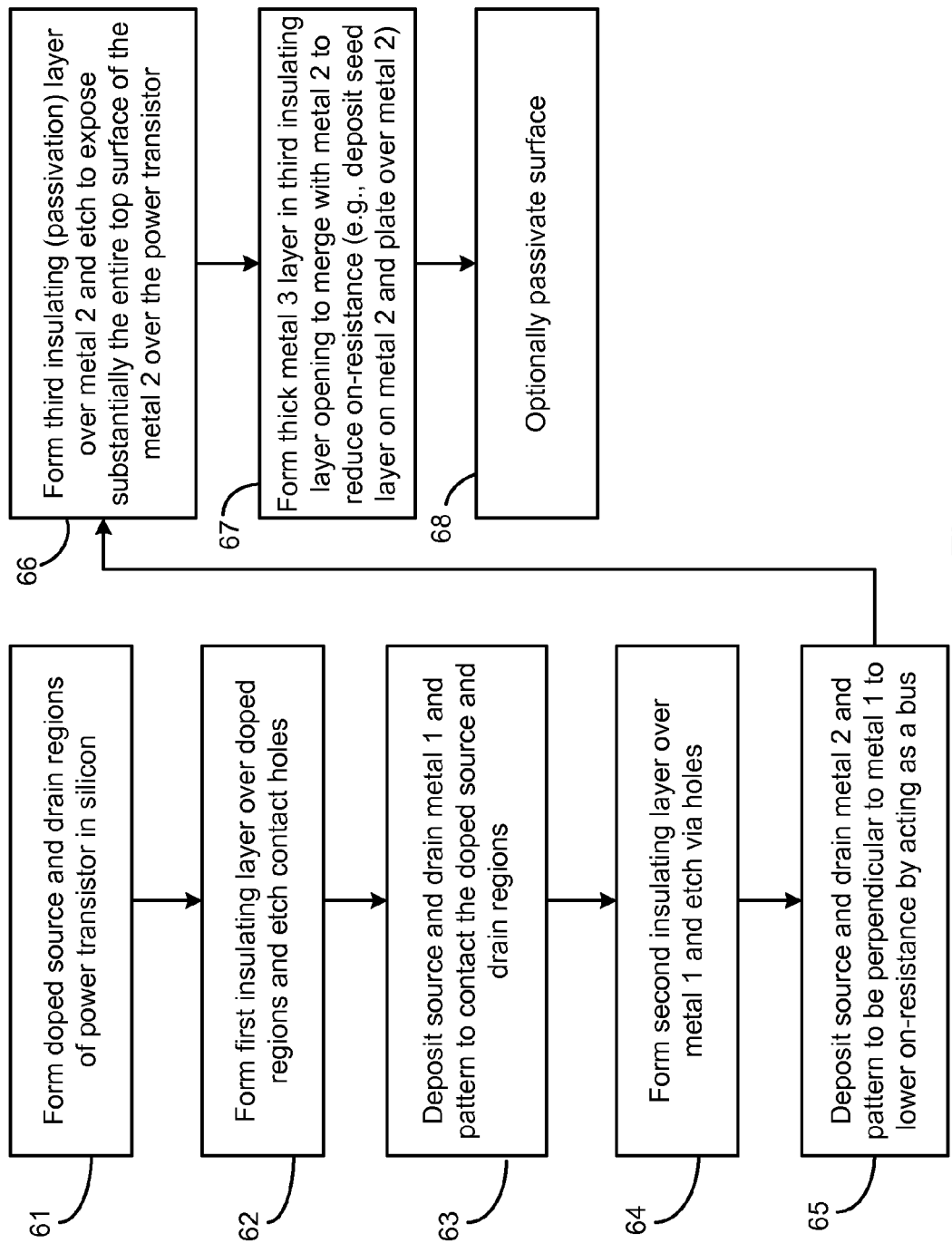
FIG. 5 is a flowchart illustrating certain steps in one embodiment of the invention.

FIG. 5 is a self-explanatory flowchart that summarizes the process described herein in steps 61-68.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A high power field effect transistor (FET) comprising:
doped regions (12, 14) formed in a semiconductor substrate forming any combination of sources and drains, the doped regions comprising source regions (12) formed as strips and drain regions (14) formed as strips between strips of source regions, the strips of source regions and the strips of drain region being parallel;
a first metal layer (24, 26) patterned to electrically contact at least some of the doped regions, the first metal layer carrying FET current, the first metal layer comprising a first set of strips (24) overlying and contacting the strips of source regions, the first metal layer also comprising a second set of strips (26) overlying and contacting the strips of drain regions, the first set of strips being insulated from the second set of strips,
the first metal layer also comprising a first metal layer source bus strip (24) perpendicular to the first set of strips and contacting each of the strips in the first set of strips at a first end,
the first metal layer also comprising a first metal layer drain bus strip (26) perpendicular to the second set of strips and contacting each of the strips in the second set of strips at a second end the second end being opposite to the first end;
a first insulating layer (28), having first contact holes, overlying a surface of the FET including overlying the first metal layer (24, 26);

a second metal layer (32, 34) overlying the first insulating layer and patterned to electrically contact the first metal layer (24, 26) through the first contact holes, the second metal layer carrying FET current, the second metal layer forming at least a first source bus strip (32) perpendicular to the first set of strips (24) and contacting the first set of strips through some of the first contact holes, the second metal layer also forming at least a first drain bus strip (34) perpendicular to the second set of strips (26) and contacting the second set of strips through others of the first contact holes, the first source bus strip being insulated from the first drain bus strip;
a second insulating layer (38) formed overlying the surface of the FET after the second metal layer is formed, at least one opening in the second insulating layer exposing a continuous portion of at least 25 percent of a top surface area of the second metal layer that carries FET current; and
a third metal layer (40), substantially thicker than the second metal layer, being formed in at least one opening in the second insulating layer to physically contact the second metal layer over at least 25 percent of the top surface area of the second metal layer, the third metal layer reducing an on-resistance of the FET by conducting a majority of FET current relative to current carried by the second metal layer, the third metal layer forming at least a second source bus strip (40) perpendicular to the first set of strips (24) and contacting the first set of strips via the first source bus strip (32), the third metal layer also forming at least a second drain bus strip (40) perpendicular to the second set of strips (26) and contacting the second set of strips via the first drain bus strip (34), the second source bus strip being insulated from the second drain bus strip,
wherein the second source bus strip is parallel to the first metal layer source bus strip, wherein the second drain bus strip is parallel to the first metal layer drain bus strip, wherein the second source bus strip is laterally located between the first metal layer drain bus strip and the second drain bus strip, and wherein the second drain bus strip is laterally located between the first metal layer source bus strip and the second source bus strip.

2. The FET of claim 1 wherein the third metal layer is a plating layer.

3. The FET of claim 1 wherein the third metal layer is greater than 2.0 microns thick.

4. The FET of claim 1 wherein the third metal layer merges with at least 50 percent of the top surface area of the second metal layer.

5. The FET of claim 1 wherein the third metal layer is not patterned by any etching step.

6. The FET of claim 1 further comprising bonding pads on the third metal layer for wire bonding.

7. The FET of claim 1 wherein the second insulating layer is a nitride passivation layer.

8. The FET of claim 1 wherein the first metal layer and second metal layer are primarily aluminum, and the third metal layer is primarily copper.

9. The FET of claim 1 further comprising bonding pads on the second metal layer but not on the third metal layer.

10. The FET of claim 1 wherein the third metal layer comprises a seed layer, of primarily a first element metal, and a plated layer, of primarily the first element metal.

* * * * *